United States Patent
Jiang et al.

(10) Patent No.: US 11,876,549 B2
(45) Date of Patent: Jan. 16, 2024

(54) MRI SYSTEM, METHOD FOR DETERMINING SAR VALUE OF MRI SYSTEM, AND COMPUTER-READABLE STORAGE MEDIUM

(71) Applicant: GE Precision Healthcare LLC, Wauwatosa, WI (US)

(72) Inventors: Weiman Jiang, Beijing (CN); Fan Yang, Beijing (CN); Kun Wang, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 133 days.

(21) Appl. No.: 17/580,967

(22) Filed: Jan. 21, 2022

(65) Prior Publication Data
US 2022/0278705 A1    Sep. 1, 2022

(30) Foreign Application Priority Data
Feb. 26, 2021   (CN) .......................... 202110215823.6

(51) Int. Cl.
*H04B 1/3827* (2015.01)
*G01R 33/28* (2006.01)

(52) U.S. Cl.
CPC ......... *H04B 1/3838* (2013.01); *G01R 33/288* (2013.01)

(58) Field of Classification Search
CPC ................ H04B 1/3838; G01R 33/288; G01R 33/34007; G01R 33/44; G01R 33/48
See application file for complete search history.

(56) References Cited

U.S. PATENT DOCUMENTS

| 9,714,993 B2 | 7/2017 | Hamamura | |
|---|---|---|---|
| 2010/0244840 A1* | 9/2010 | McKinnon | G01R 33/3415 324/322 |
| 2015/0219738 A1* | 8/2015 | Chen | A61B 5/055 324/309 |

OTHER PUBLICATIONS

Mansfield et al., "NMR imaging in Biomedicine," Academic Press, NY, 1982, p. 313-331, 19 pages.

* cited by examiner

*Primary Examiner* — Jay Patidar

(57) ABSTRACT

In the present invention, provided are a magnetic resonance imaging system, a method for determining a SAR value of a magnetic resonance imaging system, and a computer-readable storage medium. The system comprises a radio-frequency transmitting coil, configured to receive radio-frequency power from a radio-frequency transmitting link and transmit radio-frequency power required for imaging to a scanned object. The system further comprises a reflection coefficient determining module, a resistance value determining module, and a SAR value determining module. The reflection coefficient determining module is configured to acquire a frequency response of a first input reflection coefficient of the radio-frequency transmitting coil when having no load and a frequency response of a second input reflection coefficient thereof when having the scanned object. The resistance value determining module is configured to determine a resistance value of the radio-frequency transmitting coil on the basis of the frequency response of the first input reflection coefficient, and determine a parallel resistance value of the radio-frequency transmitting coil and the scanned object on the basis of the frequency response of the second input reflection coefficient. The SAR value determining module is configured to calculate a SAR value of the scanned object on the basis of the resistance value of the radio-frequency transmitting coil and the parallel resistance value.

20 Claims, 7 Drawing Sheets

MRI SYSTEM, METHOD FOR DETERMINING SAR VALUE OF MRI SYSTEM, AND COMPUTER-READABLE STORAGE MEDIUM

CROSS REFERENCE

The present application claims priority and benefit of Chinese Patent Application No. 202110215823.6 filed on Feb. 26, 2021, which in incorporated herein by reference in its entirety.

FIELD OF THE INVENTION

The present invention relates to the field of medical imaging, in particular to a magnetic resonance imaging (MRI) system, a method for determining a SAR value in a magnetic resonance imaging system, and a computer-readable storage medium for performing the method.

BACKGROUND OF THE INVENTION

During a process of using a magnetic resonance imaging system to image a scanned object, a radio-frequency transmitting coil is used to transmit a radio-frequency excitation pulse to a tissue to be imaged, and a large part of the power of the radio-frequency excitation pulse is absorbed by the human body and converted into thermal energy. If the tissue to be imaged absorbs excessive radio-frequency energy in a short time, local burns and even greater safety issues may be caused.

In order to avoid such safety issues, when a magnetic resonance imaging scan is conducted, it is usually necessary to monitor or evaluate a radio-frequency energy absorption rate, also known as a SAR value (Specific Absorption Rate), to determine whether heat absorbed by the human body exceeds a safe range.

In the prior art, a pick-up coil coupled to the radio-frequency transmitting coil can be used to measure a coil loss in real time, so as to use the coil loss to calculate the SAR value. However, setting up the pick-up coil not only increases hardware costs, but also makes the system design more complicated. Another way is to use a conservatively estimated coil loss value to calculate the SAR value. However, an overly conservative estimate will limit the selection of scanning parameters and is not conducive to acquiring an ideal image.

If a more accurate SAR value can be obtained, not only the safety of the object can be guaranteed, but also more proper scanning parameters can be obtained, especially for special patients such as infants, pregnant women, and those carrying implants, making it possible to obtain higher quality images under the premise of safe scanning.

BRIEF DESCRIPTION OF THE INVENTION

An aspect of the present invention provides a magnetic resonance imaging system, comprising: a radio-frequency transmitting coil, configured to receive radio-frequency power from a radio-frequency transmitting link and transmit radio-frequency power required for imaging to a scanned object; a reflection coefficient determining module, configured to acquire a frequency response of a first input reflection coefficient of the radio-frequency transmitting coil when having no load and a frequency response of a second input reflection coefficient thereof when having the scanned object; a resistance value determining module, configured to determine a resistance value of the radio-frequency transmitting coil on the basis of the frequency response of the first input reflection coefficient, and determine a parallel resistance value of the radio-frequency transmitting coil and the scanned object on the basis of the frequency response of the second input reflection coefficient; and a SAR value determining module, configured to calculate a SAR value of the scanned object on the basis of the resistance value of the radio-frequency transmitting coil and the parallel resistance value.

In another aspect, the reflection coefficient determining module is configured to: receive a first forward signal and a first reverse signal that are detected when the radio-frequency transmitting coil has no load; receive a second forward signal and a second reverse signal that are detected when the radio-frequency transmitting coil has the scanned object; calculate the frequency response of the first input reflection coefficient on the basis of a frequency response of the first forward signal and a frequency response of the first reverse signal; and calculate the frequency response of the second input reflection coefficient on the basis of a frequency response of the second forward signal and a frequency response of the second reverse signal.

In another aspect, the system further comprises a signal receiving and detecting device disposed at a transmission line port of the radio-frequency transmitting link, the signal receiving and detecting device being configured to detect the first forward signal, the first reverse signal, the second forward signal, and the second reverse signal.

In another aspect, the resistance value determining module is configured to calculate the resistance value of the radio-frequency transmitting coil on the basis of the frequency response of the first input reflection coefficient and an intrinsic impedance of the radio-frequency transmitting link, and the resistance value determining module is further configured to calculate the parallel resistance value of the radio-frequency transmitting coil and the scanned object on the basis of the frequency response of the second input reflection coefficient and the intrinsic impedance of the radio-frequency transmitting link.

In another aspect, the frequency response of the first input reflection coefficient comprises: a frequency response of the first input reflection coefficient at a resonant frequency of the radio-frequency transmitting coil when the radio-frequency transmitting coil has no load; the frequency response of the second input reflection coefficient comprises: a frequency response of the second input reflection coefficient at a resonant frequency of the radio-frequency transmitting coil when the radio-frequency transmitting coil has the scanned object.

The resistance value determining module is further configured to: calculate the resistance value of the radio-frequency transmitting coil on the basis of the frequency response of the first input reflection coefficient at the resonant frequency and an intrinsic impedance of the radio-frequency transmitting link; and calculate the parallel resistance value on the basis of the frequency response of the second input reflection coefficient at the resonant frequency and the intrinsic impedance of the radio-frequency transmitting link.

In another aspect, the system further comprises a memory for storing at least one of the frequency response of the first input reflection coefficient, the frequency response of the second input reflection coefficient, the resistance value of the radio-frequency transmitting coil, and the parallel resistance value.

In another aspect, the resistance value determining module calculates the resistance value of the radio-frequency transmitting coil on the basis of the following equation:

$$|S11| = \frac{|R_{ec} - Z_0|}{|R_{ec} + Z_0|} \cdot \frac{\left|\cos\left(\text{atan}\left(\frac{Z_0}{R_{ec} + Z_0} Q_{ec}\left(\frac{\omega_a}{\omega_0} - \frac{\omega_0}{\omega_a}\right)\right)\right)\right|}{\left|\cos\left(\text{atan}\left(\frac{Z_0}{R_{ec} + Z_0} Q_{ec}\left(\frac{\omega_a}{\omega_0} - \frac{\omega_0}{\omega_a}\right)\right)\right)\right|}$$

the resistance value determining module calculates the parallel resistance value of the radio-frequency transmitting coil and the scanned object on the basis of the following equation:

$$|S11|' = \frac{|R_{el} - Z_0|}{|R_{el} + Z_0|} \cdot \frac{\left|\cos\left(\text{atan}\left(\frac{Z_0}{R_{el} + Z_0} Q_{el}\left(\frac{\omega_b}{\omega'_0} - \frac{\omega'_0}{\omega}\right)\right)\right)\right|}{\left|\cos\left(\text{atan}\left(\frac{Z_0}{R_{el} - Z_0} Q_{el}\left(\frac{\omega_b}{\omega'_0} - \frac{\omega'_0}{\omega_b}\right)\right)\right)\right|}$$

wherein $R_{ec}$ is the resistance value of the radio-frequency transmitting coil, $R_{el}$ is the parallel resistance value of the radio-frequency transmitting coil and the scanned object, |S11| is the first input reflection coefficient when an operating frequency of the radio-frequency transmitting coil is $\omega_a$, |S11'| is the second input reflection coefficient when the operating frequency of the radio-frequency transmitting coil is $\omega_b$, $Z_0$ is the intrinsic impedance of the radio-frequency transmitting link, which is a known value, $\omega_0$ is the resonant frequency of the radio-frequency transmitting coil when having no load, $\omega'_0$ is the resonant frequency of the radio-frequency transmitting coil when having the scanned object, $Q_{ec} = R_{ec} C_{ec} \omega_0$ and $Q_{el} = R_{el} C_{el} \omega_0$, wherein $C_{ec}$ is an equivalent capacitance of the radio-frequency transmitting coil when having no load, and $C_{el}$ is an equivalent parallel capacitance of the radio-frequency transmitting coil and the scanned object when the radio-frequency transmitting coil has the scanned object.

In another aspect, the SAR value determining module is further configured to: receive the second forward signal and the second reverse signal that are currently detected, and calculate, on the basis of the second forward signal and the second reverse signal that are currently detected, total radio-frequency power currently absorbed by the radio-frequency transmitting coil and the scanned object; calculate the proportion of radio-frequency power absorbed by the scanned object in the total radio-frequency power on the basis of the ratio of a resistance value of the scanned object to the resistance value of the radio-frequency transmitting coil, wherein the resistance value of the scanned object is calculated on the basis of the parallel resistance value and the resistance value of the radio-frequency transmitting coil; and calculate the SAR value of the scanned object on the basis of the total radio-frequency power, the weight of the scanned object, and the proportion.

Another aspect of the present invention further provides a method for determining a SAR value of a magnetic resonance imaging system, the magnetic resonance imaging system comprising a radio-frequency transmitting coil configured to receive radio-frequency power from a radio-frequency transmitting link and transmit radio-frequency power required for imaging to a scanned object, the method comprising: acquiring a frequency response of a first input reflection coefficient of the radio-frequency transmitting coil when having no load and a frequency response of a second input reflection coefficient thereof when having the scanned object; calculating a resistance value of the radio-frequency transmitting coil on the basis of the frequency response of the first input reflection coefficient, and determining a parallel resistance value of the radio-frequency transmitting coil and the scanned object on the basis of the frequency response of the second input reflection coefficient; and calculating a SAR value of the scanned object on the basis of the resistance value of the radio-frequency transmitting coil and the parallel resistance value.

In another aspect, the step of acquiring the first input reflection coefficient and the second input reflection coefficient comprises: receiving a first forward signal and a first reverse signal that are detected when the radio-frequency transmitting coil has no load; receiving a second forward signal and a second reverse signal that are detected when the radio-frequency transmitting coil has the scanned object; calculating the frequency response of the first input reflection coefficient on the basis of a frequency response of the first forward signal and a frequency response of the first reverse signal; and calculating the frequency response of the second input reflection coefficient on the basis of a frequency response of the second forward signal and a frequency response of the second reverse signal.

In another aspect, the method further comprises: controlling a signal receiving and detecting device to detect the first forward signal, the first reverse signal, the second forward signal, and the second reverse signal, wherein the signal receiving and detecting device is disposed at a transmission line port of the radio-frequency transmitting link.

In another aspect, the first forward signal, the first reverse signal, the second forward signal, and the second reverse signal are detected during a process of adjusting a radio frequency of the magnetic resonance imaging system.

In another aspect, the first forward signal and the first reverse signal are detected during system calibration performed on the magnetic resonance imaging system.

In another aspect, the second forward signal and the second reverse signal are detected during a process of pre-scanning of the scanned object.

In another aspect, the resistance value of the radio-frequency transmitting coil is calculated on the basis of the frequency response of the first input reflection coefficient and an intrinsic impedance of the radio-frequency transmitting link; and the parallel resistance value is calculated on the basis of the frequency response of the second input reflection coefficient and the intrinsic impedance of the radio-frequency transmitting link.

In another aspect, the frequency response of the first input reflection coefficient comprises: a frequency response of the first input reflection coefficient at a resonant frequency of the radio-frequency transmitting coil when the radio-frequency transmitting coil has no load; the frequency response of the second input reflection coefficient comprises: a frequency response of the second input reflection coefficient at a resonant frequency of the radio-frequency transmitting coil when the radio-frequency transmitting coil has the scanned object; the method further comprises: calculating the resistance value of the radio-frequency transmitting coil on the basis of the frequency response of the first input reflection coefficient at the resonant frequency and the intrinsic impedance of the radio-frequency transmitting link; and calculating the parallel resistance value on the basis of the frequency response of the second input reflection coefficient at the resonant frequency and the resonant frequency and the intrinsic impedance of the radio-frequency transmitting link.

In another aspect, the resistance value of the radio-frequency transmitting coil is calculated on the basis of the following equation:

$$|S11| = \frac{|R_{ec} - Z_0|}{|R_{ec} + Z_0|} \cdot \frac{\left|\cos\left(\mathrm{atan}\left(\frac{Z_0}{R_{ec}+Z_0} Q_{ec}\left(\frac{\omega_a}{\omega_0} - \frac{\omega_0}{\omega}\right)\right)\right)\right|}{\left|\cos\left(\mathrm{atan}\left(\frac{Z_0}{R_{ec}-Z_0} Q_{ec}\left(\frac{\omega_a}{\omega_0} - \frac{\omega_0}{\omega_a}\right)\right)\right)\right|};$$

the parallel resistance value of the radio-frequency transmitting coil and the scanned object is calculated on the basis of the following equation:

$$|S11|' = \frac{|R_{el} - Z_0|}{|R_{el} + Z_0|} \cdot \frac{\left|\cos\left(\mathrm{atan}\left(\frac{Z_0}{R_{el}+Z_0} Q_{el}\left(\frac{\omega_b}{\omega'_0} - \frac{\omega'_0}{\omega}\right)\right)\right)\right|}{\left|\cos\left(\mathrm{atan}\left(\frac{Z_0}{R_{el}-Z_0} Q_{el}\left(\frac{\omega_b}{\omega'_0} - \frac{\omega'_0}{\omega_b}\right)\right)\right)\right|}.$$

In another aspect, the step of calculating the SAR value comprises: receiving the second forward signal and the second reverse signal that are currently detected, and calculating, on the basis of the current second forward signal and second reverse signal, total radio-frequency power currently absorbed by the radio-frequency transmitting coil and the scanned object; and calculating the proportion of radio-frequency power absorbed by the scanned object in the total radio-frequency power on the basis of the ratio of a resistance value of the scanned object to the resistance value of the radio-frequency transmitting coil, wherein the resistance value of the scanned object is calculated on the basis of the parallel resistance value and the resistance value of the radio-frequency transmitting coil; and calculating the SAR value of the scanned object on the basis of the total radio-frequency power, the weight of the scanned object, and the proportion.

Another aspect of the present invention further provides a magnetic resonance imaging system, comprising: a radio-frequency transmitting coil, configured to acquire radio-frequency power through a radio-frequency transmitting link and transmit radio-frequency power required for imaging to a scanned object; and a processor, configured to perform the method according to any one of the above aspects.

Another aspect of the present invention further provides a computer-readable storage medium, the computer-readable storage medium comprising a stored computer program, wherein the method according to any one of the above aspects is performed when the computer program is run.

It should be understood that the brief description above is provided to introduce, in simplified form, some concepts that will be further described in the Detailed Description. The brief description above is not meant to identify key or essential features of the claimed subject matter. The scope is defined uniquely by the claims that follow the detailed description. Furthermore, the claimed subject matter is not limited to implementations that solve any disadvantages noted above or in any section of the present disclosure.

BRIEF DESCRIPTION OF THE DRAWINGS

The present invention will be better understood by reading the following description of non-limiting embodiments with reference to the accompanying drawings, where.

DETAILED DESCRIPTION

Specific implementations of the present invention will be described in the following. It should be noted that during the specific description of the implementations, it is impossible to describe all features of the actual implementations in detail in this description for the sake of brief description. It should be understood that in the actual implementation of any of the implementations, as in the process of any engineering project or design project, a variety of specific decisions are often made in order to achieve the developer's specific objectives and meet system-related or business-related restrictions, which will vary from one implementation to another. Moreover, it can also be understood that although the efforts made in such development process may be complex and lengthy, for those of ordinary skill in the art related to content disclosed in the present invention, some changes in design, manufacturing, production or the like based on the technical content disclosed in the present disclosure are only conventional technical means, and should not be construed as that the content of the present disclosure is insufficient.

Unless otherwise defined, the technical or scientific terms used in the claims and the description are as they are usually understood by those of ordinary skill in the art to which the present invention pertains. Terms such as "first," "second," and similar words used in this specification and claims do not denote any order, quantity, or importance, but are only intended to distinguish different constituents. The term "one", "a(n)", or a similar term is not meant to be limiting, but rather denote the presence of at least one. The term "include", "comprise", or a similar term is intended to mean that an element or article that appears before "include" or "comprise" encompasses an element or article and equivalent elements that are listed after "include" or "comprise", and does not exclude other elements or articles. The term "connect", "connected", or a similar term is not limited to a physical or mechanical connection, and is not limited to a direct or indirect connection.

Figure 1:
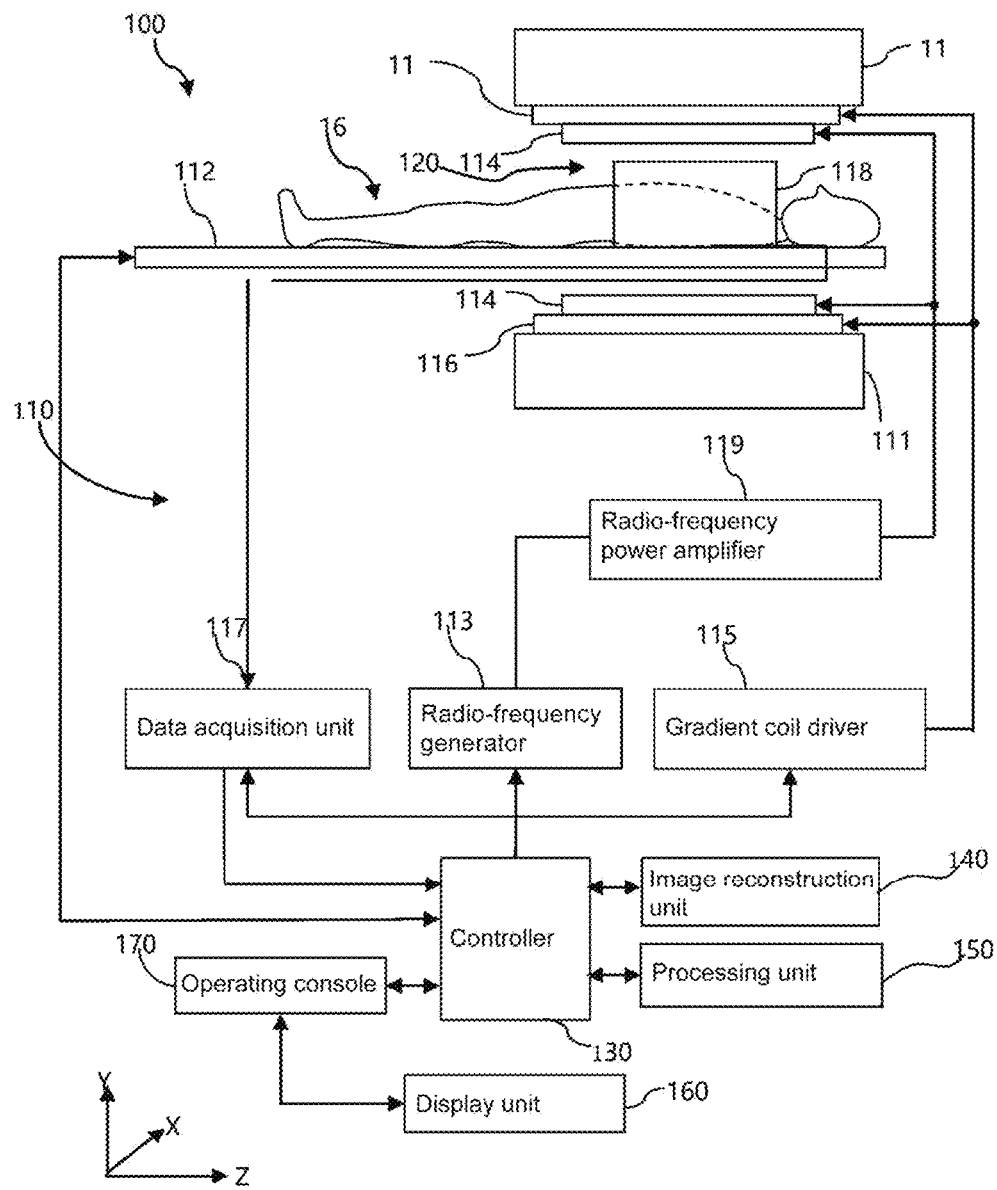
FIG. 1 shows a schematic structural diagram of a magnetic resonance imaging system in some embodiments.

FIG. 1 shows a schematic structural diagram of a magnetic resonance imaging (MRI) system. The magnetic resonance imaging system 100 includes a scanner 110. The scanner 110 is configured to perform magnetic resonance scanning on an object (for example, a human body) 16 to produce image data of a region of interest of the object 16, and the region of interest may be a predetermined imaging part or imaging tissue.

The magnetic resonance imaging system 100 may include a controller 130 coupled to the scanner 110 so as to control the scanner 110 to perform the aforementioned magnetic resonance scanning procedure.

In an example, the scanner 110 may include a main magnet assembly 111, a table 112, a radio-frequency generator 113, a radio-frequency power amplifier 119, a radio-frequency transmitting coil 114, a surface coil 118, a gradient coil driver 115, a gradient coil assembly 116, and a data acquisition unit 117.

The main magnet assembly 111 usually includes an annular superconducting magnet defined in a housing. The annular superconducting magnet is mounted in an annular vacuum container. The annular superconducting magnet and the housing thereof define a cylindrical space surrounding the object 16, such as a scanning chamber 120 shown in FIG. 1. The main magnet assembly 111 generates a constant magnetic field, i.e., a B0 field, in a Z direction of the scanning chamber 120. Typically, a uniform portion of the B0 field is formed in a central region of the main magnet.

The table 112 is configured to carry the object 16, and travel in the Z direction to enter or exit the aforementioned scanning chamber 120 in response to the control of the controller 130. For example, in one embodiment, an imaging volume of the object 16 may be positioned in a central region of the scanning chamber with uniform magnetic field strength so as to facilitate scanning imaging of the imaging volume of the object 16.

The Z direction is typically the direction extending from the head to the feet (or from the feet to the head) when the object 16 is positioned on the table 112. For example, a selected layer may be a slice at any position in the Z direction.

The magnetic resonance imaging system 100 uses the formed B0 field to transmit a static magnetic field to the object 16 located in the scanning chamber, so that protons in a resonant region in the body of the object 16 process in an ordered manner to generate a longitudinal magnetization vector.

The radio-frequency generator 113 is configured to generate a radio-frequency pulse, such as a radio-frequency excitation pulse, in response to a control signal of the controller 130. The radio-frequency power amplifier 119 is configured to amplify a low-power signal generated by the radio-frequency generator 113 to generate a high-power radio-frequency signal that can excite the human tissue. The high-power radio-frequency signal can be inputted to the radio-frequency transmitting coil 114 via a radio-frequency transmitting line, so that the radio-frequency transmitting coil 114 transmits a radio-frequency field B1 orthogonal to the B0 field to the object 16 to excite atomic nuclei in the aforementioned resonant region to generate a transverse magnetization vector.

The radio-frequency transmitting coil 114 may include, for example, a body coil disposed along an inner circumference of the main magnet, or a local coil dedicated to local imaging.

After the radio-frequency excitation pulse ends, the proton group becomes out-of-phase, the macroscopic transverse magnetization vector in the tissue gradually decays, a free induction decay signal, namely, a magnetic resonance signal that can be acquired, is generated during the process in which the transverse magnetization vector of the object 16 is gradually restored to zero.

The gradient coil driver 115 is configured to provide a suitable current/power to the gradient coil assembly 116 in response to a gradient pulse control signal or a shimming control signal sent from the controller 130.

The gradient coil assembly 116, on one hand, forms a varying magnetic field in an imaging space so as to provide three-dimensional position information for the aforementioned magnetic resonance signal, and on the other hand generates a compensating magnetic field of the B0 field to shim the B0 field.

The gradient coil assembly 116 may include three gradient coils, which are respectively configured to generate magnetic field gradients inclined to three spatial axes (for example, the X-axis, Y-axis, and Z-axis) perpendicular to each other. More specifically, the gradient coil assembly 116 applies a magnetic field gradient in a slice selection direction (such as the Z direction) so as to select a layer in the imaging region. Those skilled in the art understand that the layer is any one of a plurality of two-dimensional slices distributed in the Z direction in the three-dimensional imaging volume. When the imaging region is scanned, the radio-frequency transmitting coil 114 transmits radio-frequency excitation pulses to the layer of the imaging region and excites the layer in response to the aforementioned I and Q radio-frequency excitation signals. The gradient coil assembly 116 applies a magnetic field gradient in a phase encoding direction (such as the Y direction) so as to perform phase encoding on a magnetic resonance signal of the excited layer. The gradient coil assembly 116 applies a gradient field in a frequency encoding direction (such as the X direction) of the object 16 so as to perform frequency encoding on the magnetic resonance signal of the excited layer.

The aforementioned radio-frequency transmitting coil 114 may be connected to a transmitting/receiving (T/R) switch (not shown). The transmitting/receiving switch is controlled so that the body coil can be switched between a transmitting mode and a receiving mode. In the receiving mode, the radio-frequency transmitting coil may be configured to receive a magnetic resonance signal from the object 16.

The surface coil 118 is usually arranged close to a scan part (region of interest) of the object 16 (for example, covering or laying on the body surface of the object 16), and the surface coil 118 is also configured to receive a magnetic resonance signal from the object 16.

The data acquisition unit 117 is configured to acquire the aforementioned magnetic resonance signal (for example, received by the body coil or the surface coil) in response to a data acquisition control signal of the controller 130. In one embodiment, the data acquisition unit 117 may include, for example, a radio-frequency preamplifier, a phase detector, and an analog/digital converter, where the radio-frequency preamplifier is configured to amplify the magnetic resonance signal, the phase detector is configured to perform phase detection on the amplified magnetic resonance signal, and the analog/digital converter is configured to convert the phase-detected magnetic resonance signal from an analog signal to a digital signal.

The data acquisition unit 117 is further configured to store the digitized magnetic resonance signal (or echo) into a K space in response to a data storage control signal of the controller 130. The K-space is a space to which raw data of magnetic resonance signals carrying spatial orientation encoding information is populated. Specifically, the data acquisition unit 117 fills the digitized magnetic resonance signal into the K-space in a specific manner in response to the data storage control signal of the controller 130.

Those skilled in the art can understand that when imaging scanning is performed on the object 16, the controller 130 can use a sequence generator (not shown in the figure) to send sequence control signals to the aforementioned components (for example, the radio-frequency generator 113, the gradient coil driver 115, etc.) of the scanner 110, so that the scanner 110 performs a preset scanning sequence.

In addition, during the process of performing the scan, the controller 130 may calculate a SAR value on the basis of a feedback/detected signal (for example, a coil loss of the radio-frequency transmitting coil 114), and set/adjust scan parameters on the basis of the calculated SAR value. The scan parameters may include, for example, scan repetition time, the number of excitations, the strength of a radio-frequency transmitting signal, selection of a scan sequence, etc.

Those skilled in the art could understand that the "scan sequence" refers to a combination of pulses having specific amplitudes, widths, directions, and time sequences and applied when a magnetic resonance imaging scan is performed. The pulses may typically include, for example, a radio-frequency pulse and a gradient pulse. The radio-frequency pulse may include, for example, a radio-frequency transmit pulse, a radio-frequency refocusing pulse, etc., that are used to excite protons in the human body to resonate. The gradient pulse may include, for example, a layer selection gradient pulse, a phase encoding gradient pulse, a frequency encoding gradient pulse, etc. Typically, a plurality of scan sequences may be pre-configured in a magnetic resonance system, so that a sequence corresponding to clinical test requirements is selectable. The clinical test requirements may include, for example, a part to be imaged, an imaging function, an imaging effect, etc.

Performing magnetic resonance scanning on the object 16 may include a positioning scan (three plain scan) and a formal scan. One or a plurality of scan sequences may be performed during the positioning scan and the formal scan. In the positioning scan, at least one of a coronal positioning image, a sagittal positioning image, and a transverse positioning image of the object may be acquired, and a scan parameter of the formal scan, for example, a scan range of the formal scan, may be determined on the basis of the positioning image. Before the one or plurality of scan sequences of the positioning scan or the formal scan are performed, a pre-scan may be performed automatically or manually. In the pre-scan process, a frequency may be adjusted to determine a Larmor frequency of proton resonance of the current scan on the basis of magnetic resonance signal feedback at different frequencies, and a radio-frequency transmitting intensity may be adjusted to determine radio-frequency transmission power of the current scan on the basis of magnetic resonance signal feedback under different radio-frequency transmission intensities.

In addition, when the magnetic resonance imaging system is calibrated, the frequency will also be adjusted. The system calibration may be performed when the magnetic resonance imaging system is shipped from a factory or during routine maintenance. Such calibration may be performed when the magnetic resonance imaging system has no load.

The magnetic resonance imaging system 100 may include an image reconstruction unit 140, which is configured to perform an inverse Fourier transform on data stored in the K-space to reconstruct a three-dimensional image or a series of two-dimensional slice images of the imaging volume of the object 16. Specifically, the image reconstruction unit 140 may perform the aforementioned image reconstruction on the basis of communication with the controller 130.

The magnetic resonance imaging system 100 may include a processing unit 150, which may perform any required image post-processing on the aforementioned three-dimensional image or any image in an image sequence. The post-processing may be an improvement or adaptive adjustment made to an image in any of contrast, uniformity, sharpness, brightness, etc. Specifically, the processing unit 150 may perform the image processing method according to an embodiment of the present invention on the basis of communication with the controller 130.

In one embodiment, the controller 130, the image reconstruction unit 140, and the processing unit 150 may separately or collectively include a computer processor and a storage medium. The storage medium records a predetermined data processing program to be executed by the computer processor. For example, the storage medium may store a program used to implement scanning processing, image reconstruction, image processing, etc. For example, the storage medium may store a program used to implement the method for determining a SAR value according to an embodiment of the present invention. The storage medium may include, for example, a ROM, a floppy disk, a hard disk, an optical disk, a magneto-optical disk, a CD-ROM, or a non-volatile memory card.

The magnetic resonance imaging system 100 may include a display unit 160, which may be used to display an operation interface and various data, images, or parameters generated in the image acquisition and processing processes.

The magnetic resonance imaging system 100 includes an operation console 170, which may include user input devices, such as a keyboard, a mouse, etc. The controller 130 may communicate with the scanner 110, the image reconstruction unit 140, the image processing unit 150, the display unit 160, etc., in response to a control command generated by a user on the basis of operating the console 170 or an operation panel/button, etc., disposed on the housing of the main magnet.

Figure 2:
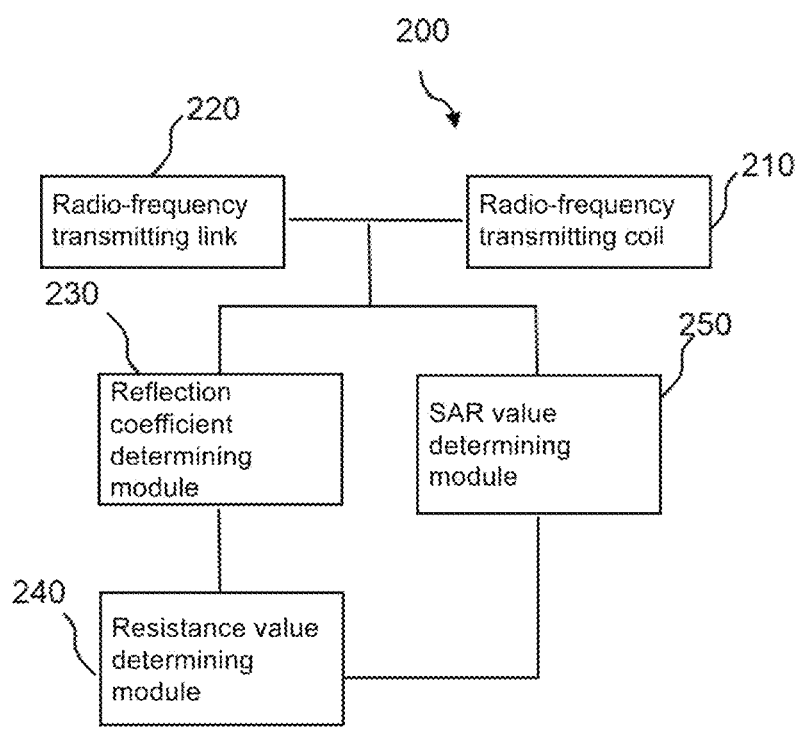
FIG. 2 shows a block diagram of a magnetic resonance imaging system according to an embodiment of the present invention.

FIG. 2 shows a block diagram 200 of a magnetic resonance imaging system according to an embodiment of the present invention, which may include part or all of the components of the system 100 shown in FIG. 1. For example, the system 200 includes a radio-frequency transmitting coil 210, which is configured to receive radio-frequency power from a radio-frequency transmitting link 220 and transmit radio-frequency power required for imaging to a scanned object.

Figure 3:
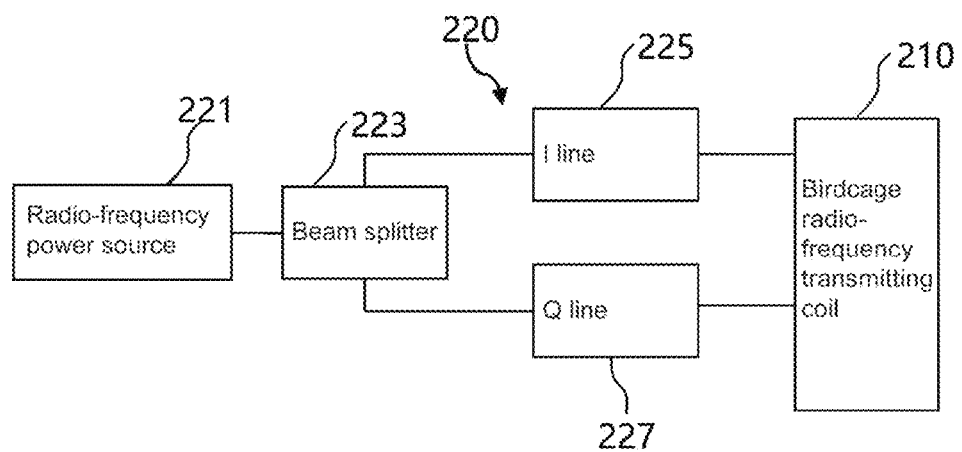
FIG. 3 shows a schematic structural diagram of a radio-frequency transmitting link of a radio-frequency transmitting coil according to an embodiment of the present invention.

FIG. 3 shows a radio-frequency transmitting link 220 according to an embodiment. As shown in FIG. 3, the radio-frequency transmitting link 220 may include a transmission line and a transmission device between a radio-frequency power source 221 and a radio-frequency transmitting coil 210. The radio-frequency power source 221 may include a radio-frequency power amplifier. The transmission device may include, for example, a beam splitter 223, which is configured to split a radio-frequency signal outputted by the radio-frequency power source 221 into two orthogonal (with a phase difference of 90 degrees) signals, one of which is transmitted to the birdcage radio-frequency transmitting coil 210 via an I line 225, and the other is transmitted to the birdcage radio-frequency transmitting coil 210 via a Q line 227.

As shown in FIG. 2, the system 200 further includes a reflection coefficient determining module 230, a resistance value determining module 240, and a SAR value determining module 250.

The reflection coefficient determining module 230 is configured to acquire a frequency response of a first input reflection coefficient when the radio-frequency transmitting coil 210 has no load and a frequency response of a second input reflection coefficient when the radio-frequency transmitting coil has the scanned object.

Those skilled in the art understand that no object to be imaged is located in an imaging region of the magnetic resonance imaging system when the radio-frequency transmitting coil is operating without a load. For example, there is no object to be imaged in a scanning cavity formed by a main magnet. Therefore, a radio-frequency transmitting pulse emitted by the radio-frequency transmitting coil is not applied to the object to be imaged. When the radio-frequency transmitting coil has a scanned object, the object to be imaged may be positioned in the imaging region to receive the radio-frequency transmitting pulse emitted by the radio-frequency transmitting coil 210, and, in response to the radio-frequency transmitting pulse, generate a magnetic resonance signal that can be acquired.

The frequency response of the first input reflection coefficient and the frequency response of the second input reflection coefficient of the radio-frequency transmitting coil 210 may be determined by a frequency response of the ratio (for example, a voltage ratio) or the square root of the ratio (for example, a power ratio) of a reverse signal to a forward signal transmitted to the radio-frequency transmitting coil 210 when the radio-frequency transmitting signal is transmitted to the radio-frequency transmitting coil 210 via a port of the radio-frequency transmitting link 220.

The resistance value determining module 240 is configured to calculate a resistance value of the radio-frequency transmitting coil 210 on the basis of the frequency response of the first input reflection coefficient, and calculate a parallel resistance value of the radio-frequency transmitting coil 210 and the scanned object thereof (for example, the object to be imaged) on the basis of the frequency response of the second input reflection coefficient. The SAR value determining module 250 is configured to calculate a SAR value of the scanned object on the basis of the resistance value of the radio-frequency transmitting coil and the parallel resistance value of the radio-frequency transmitting coil and the scanned object.

Specifically, the reflection coefficient determining module 230 is configured to receive a frequency response of a first forward signal and a frequency response of a first reverse signal that are detected when the radio-frequency transmitting coil 210 has no load, and calculate the aforementioned frequency response of the first input reflection coefficient on the basis of the detected frequency response of the first forward signal and frequency response of the first reverse signal. The reflection coefficient determining module 230 is further configured to receive a frequency response of a second forward input signal and a frequency response of a second input reflection signal that are detected when the radio-frequency transmitting coil 210 has the scanned object, and calculate the aforementioned frequency response of the second input reflection coefficient on the basis of the detected frequency response of the second forward input signal and frequency response of the second input reflection signal.

Figure 4:
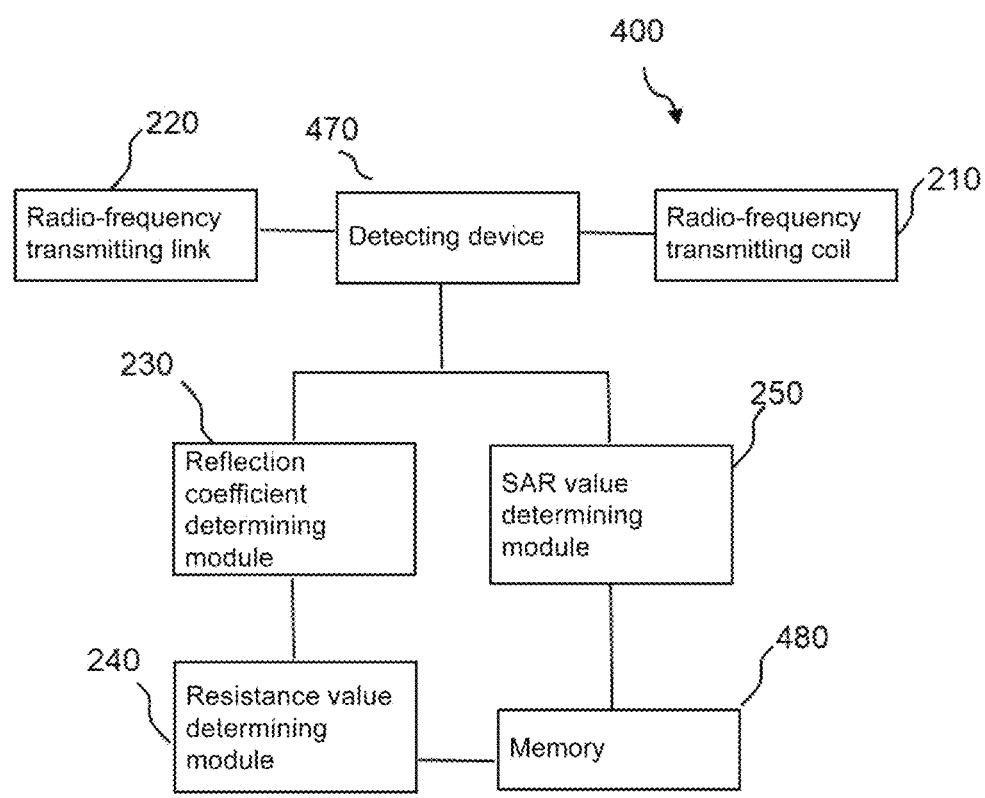
FIG. 4 shows a block diagram of a magnetic resonance imaging system according to another embodiment of the present invention.

FIG. 4 shows a block diagram 400 of a magnetic resonance imaging system according to another embodiment of the present invention. As shown in FIG. 4, the system 400 further includes a signal receiving and detecting device 470, which detects a frequency response of a forward signal and a frequency response of a reverse signal (for example, detects forward signals and reverse signals at different operating frequencies) at a port where a radio-frequency transmitting link 220 transmits power to a radio-frequency transmitting coil 210. The forward signal includes a first forward signal when there is no load and a second forward signal when there is a scanned object, and the reverse signal includes a first reverse signal when there is no load and a second reverse signal when there is the scanned object.

In one embodiment, the detecting device 470 may include a directional coupler and a power meter connected to the directional coupler. Specifically, when a radio-frequency power signal is outputted from a port including an I line and a Q line, the detecting device 470 may include a first directional coupler disposed on the I line and a power meter connected to the first directional coupler, and a second directional coupler disposed on the Q line and a power meter connected to the second directional coupler. The first directional coupler is configured to detect a forward signal and a reverse signal of the I line, and the second directional coupler is configured to detect a forward signal and a reverse signal of the Q line.

In one embodiment, the forward signal and the reverse signal that are detected by the detecting device 470 may be a voltage signal, a current signal, or a power signal.

Further, when the forward signal and the reverse signal that are detected by the detecting device 470 are voltage signals or current signals, a reflection coefficient determining module 230 is further configured to acquire corresponding forward input power and input reflection power on the basis of the forward signal and the reverse signal received from the detecting device 470, respectively. For example, when the radio-frequency transmitting coil 210 has no load, the first directional coupler detects a first forward signal and a first reverse signal of the I line, and the second directional coupler detects a first forward signal and a first reverse signal of the Q line, in which case the reflection coefficient determining module 230 acquires first forward power $P_{fwdI}$ and first reverse power $P_{rflI}$ of the I line on the basis of the first forward signal and the first reverse signal of the I line respectively, and acquires first forward power $P_{fwdQ}$ and first input reverse power $P_{rflQ}$ of the Q line on the basis of the first forward signal and the first reverse signal of the Q line respectively. When the radio-frequency transmitting coil has the scanned object, the first directional coupler detects a second forward signal and a second reverse signal of the I line, and the second directional coupler detects a second forward signal and a second reverse signal of the Q line, in which case the reflection coefficient determining module 230 acquires second forward power $P'_{fwdI}$ and second reverse power $P'_{rflI}$ of the I line on the basis of the second forward signal and the second reverse signal of the I line respectively, and acquires second forward power $P'_{fwdQ}$ and second reverse power $P'_{rflQ}$ of the Q line on the basis of the second forward signal and the second reverse signal of the Q line respectively.

In one embodiment, the reflection coefficient determining module 230 is configured to acquire the sum $P_f$ of the first forward power $P_{fwdI}$ of the I line and the first forward power $P_{fwdQ}$ of the Q line, the sum $P_r$ of the first reverse power $P_{rflI}$ of the I line and the first reverse power $P_{rflQ}$ of the Q line, the sum $P'_f$ of the second forward power $P'_{fwdI}$ of the I line and the second forward power $P'_{fwdQ}$ of the Q line, and the sum $P'_r$ of the second reverse power $P'_{rflI}$ of the I line and the second reverse power $P'_{fwdQ}$ of the Q line.

Further, the reflection coefficient determining module 240 may acquire a first input reflection coefficient |S11| on the basis of the following equation (1), and acquire a second input reflection coefficient |S11|' on the basis of equation (2).

$$|S11| = \sqrt{\frac{P_r}{P_f}} \quad (1)$$

$$|S11|' = \sqrt{\frac{P'_r}{P'_f}} \quad (2)$$

Frequency responses of the first input reflection coefficient |S11| and the second input reflection coefficient |S11|' may be expressed as reflection coefficient values at a plurality of operating frequencies. For example, first input reflection coefficients |S11| at a plurality of operating frequencies when the radio-frequency transmitting coil has no load may be acquired, and second input reflection coefficients |S11|' at a plurality of operating frequencies when the radio-frequency transmitting coil has the scanned object may further be acquired. The plurality of operating frequencies may further include a resonant frequency when there is no load and a resonant frequency when there is the scanned object. That is, the frequency response of the first input reflection coefficient may include a frequency response of the first input reflection coefficient at the resonant frequency of the radio-frequency transmitting coil, and the frequency response of the second input reflection coefficient may include a frequency response of the second input reflection coefficient at the resonant frequency of the radio-frequency transmitting coil.

The resistance value determining module 240 may determine a resistance value of the radio-frequency transmitting coil 210 and the aforementioned parallel resistance value respectively according to the frequency responses of the first input reflection coefficient and the second input reflection coefficient determined above, which will be described in detail below with reference to FIGS. 5 and 6.

Figure 5:
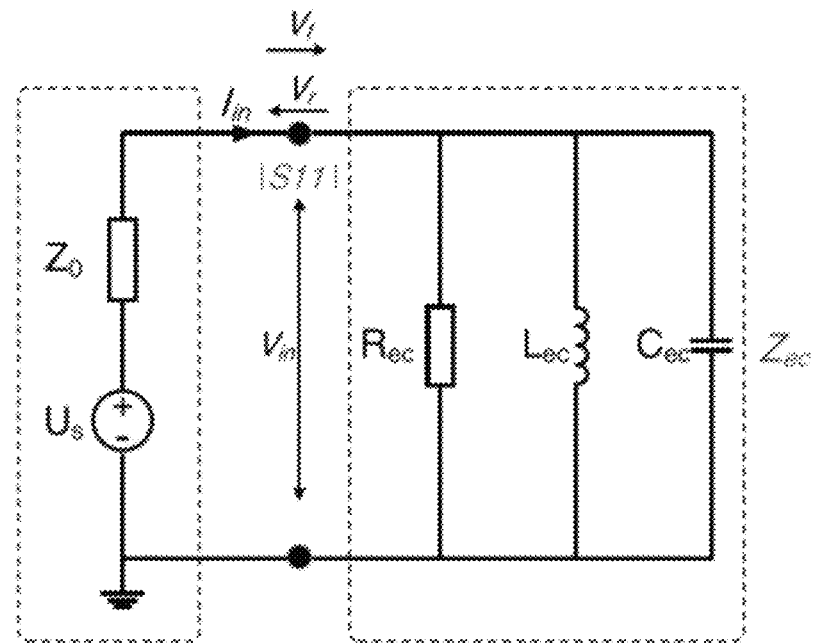
FIG. 5 shows an equivalent radio-frequency circuit of a radio-frequency transmitting coil when having no load.

FIG. 5 shows an equivalent radio-frequency circuit 500 of a radio-frequency transmitting coil 210 having no load. The circuit 500 includes a coil resistor $R_{ec}$ and an inductor $L_{ec}$ and a capacitor $C_{ec}$ connected in parallel to the coil resistor. The above coil resistor $R_{ec}$, inductor $L_{ec}$, and capacitor $C_{ec}$ are connected in parallel to be equivalent to the radio-frequency transmitting coil 210 having no load, which has an impedance of $Z_{ec}$. The circuit 500 further includes an equivalent power source $U_s$ and a radio-frequency transmitting link intrinsic impedance $Z_0$, which may be used to be equivalent to an equivalent radio-frequency power source and an internal resistance thereof, respectively.

Figure 6:
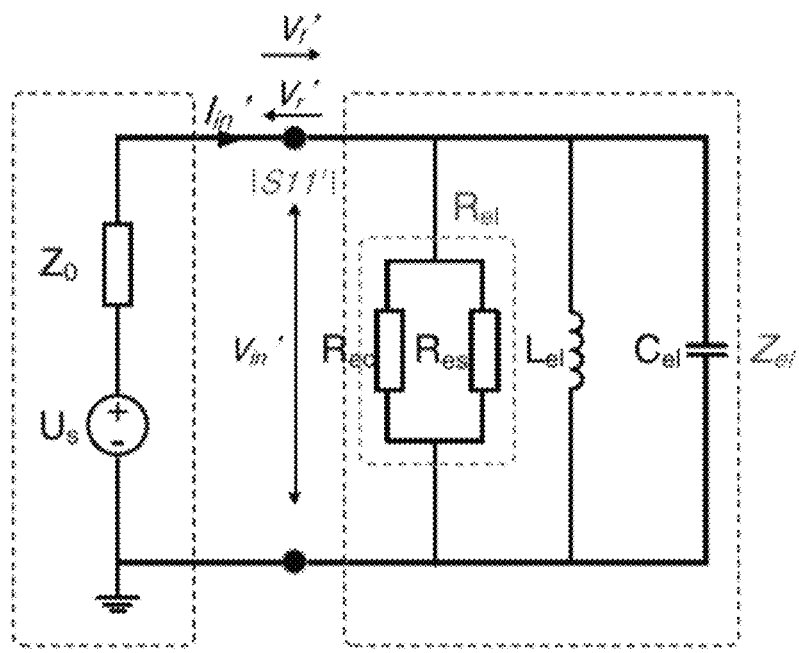
FIG. 6 shows an equivalent radio-frequency circuit of a radio-frequency transmitting coil having a scanned object.

FIG. 6 shows an equivalent radio-frequency circuit 600 of the radio-frequency transmitting coil 210 having the scanned object. The circuit 600 includes a scanned object resistor $R_{es}$ and a coil resistor $R_{ec}$ connected in parallel, where the scanned object resistor $R_{es}$ is used to be equivalent to the scanned object of the radio-frequency transmitting coil 210, for example, an object to be imaged, $R_{el}$ is used to represent a parallel resistor formed by the scanned object resistor $R_{es}$ and the coil resistor $R_{ec}$ connected in parallel. The circuit 600 further includes an inductor $L_{el}$ and a capacitor $C_{el}$ connected in parallel to the total resistor $R_{el}$. The parallel circuit formed by the above parallel resistor $R_{el}$, inductor $L_{el}$, and capacitor $C_{el}$ is used to be equivalent to the radio-frequency transmitting coil 210 and the scanned object thereof, an impedance of which is $Z_{el}$. The circuit 600 further includes an equivalent power supply $U_s$ and radio-frequency transmitting link intrinsic impedance $Z_0$.

Referring to FIG. 5, the aforementioned first input reflection coefficient may be the ratio of a reverse signal to a forward signal of the radio-frequency transmitting coil when having no load. Using a voltage signal as an example, the voltage signal provided by the equivalent power supply $U_s$ to the radio-frequency transmitting coil is $V_{in}$, part of radio-frequency power of the voltage signal is absorbed by the radio-frequency transmitting coil having no load, and the other part is reflected back to the transmission link. As a result, at a port where the radio-frequency transmitting link transmits power to the radio-frequency coil, there are a first forward signal, i.e., $V_f$, and a first reverse signal, i.e., $V_r$, in which case the first input reflection coefficient |S11| is $$\left|\frac{V_r}{V_f}\right|.$$

Referring to FIG. 6, the aforementioned second input reflection coefficient may be the ratio of an input reflection signal to a forward input signal of the radio-frequency transmitting coil having the scanned object. Still using a voltage signal as an example, assuming that the voltage signal provided by the equivalent power supply $U_s$ to the radio-frequency transmitting coil is $V_{in}$ which is applied to the equivalent parallel circuit composed of the radio-frequency transmitting coil and the scanned object, part of radio-frequency power is absorbed by the parallel equivalent circuit, and the other part is reflected back to the radio-frequency transmitting link. As a result, at the port where the radio-frequency transmitting link transmits power to the radio-frequency coil, there are a second forward signal, i.e., $V'_f$, and a second reverse signal, i.e., $V'_r$, in which case the second input reflection coefficient |S11|' is $$\left|\frac{V'_r}{V'_f}\right|.$$

The parameter values in FIG. 5 satisfy the following equations (3)-(8):

$$Z_{ec} = \frac{1}{\frac{1}{R_{ec}}\left(1 + jQ_{ec}\left(\frac{\omega_a}{\omega_0} - \frac{\omega_0}{\omega_a}\right)\right)} \quad (3)$$

$$Q_{ec} = R_{ec}C_{ec}\omega_0 = \frac{R_{ec}}{L_{ec}\omega_0} \quad (4)$$

$$\omega_0 = \frac{1}{2\pi\sqrt{L_{ec}C_{ec}}} \quad (5)$$

$$\frac{V_{in}}{V_s} = \frac{Z_{ec}}{Z_0 + Z_{ec}} \quad (6)$$

$$V_{in} = V_f + V_r \quad (7)$$

$$V_f = \frac{V_s}{2} \quad (8)$$

where $\omega_0$ is the resonant frequency of the radio-frequency transmitting coil 210 when having no load, and $\omega_a$ is an operating frequency of the radio-frequency transmitting coil when having no load.

On the basis of the above equations (6)-(8), the following equation (9) can be obtained:

$$V_r = V_{in} - V_f = \frac{V_s}{2} \cdot \frac{Z_{ec} - Z_0}{Z_{ec} + Z_0} \tag{9}$$

Since $$|S11| = \left|\frac{V_r}{V_f}\right|,$$

equation (10) is further obtained according to equation (9):

$$|S11| = \left|\frac{Z_{ec} - Z_0}{Z_{ec} + Z_0}\right| \tag{10}$$

Further combining equations (3)-(5), the following equation (11) can be obtained.

$$|S11| = \frac{|R_{ec} - Z_0|}{|R_{ec} + Z_0|} \cdot \left|\frac{\cos\left(\operatorname{atan}\left(\frac{Z_0}{R_{ec} + Z_0}Q_{ec}\left(\frac{\omega_a}{\omega_0} - \frac{\omega_0}{\omega_a}\right)\right)\right)}{\cos\left(\operatorname{atan}\left(\frac{Z_0}{R_{ec} - Z_0}Q_{ec}\left(\frac{\omega_a}{\omega_0} - \frac{\omega_0}{\omega_a}\right)\right)\right)}\right| \tag{11}$$

When the radio-frequency transmitting coil 210 has no load and operates at the resonant frequency, $\omega_a$ is equal to $\omega_0$, and equation (11) may be transformed into equation (12).

$$|S11| = \frac{|R_{ec} - Z_0|}{|R_{ec} + Z_0|} \tag{12}$$

On the basis of similar principles, a relational expression (13) of the second input reflection coefficient |S11|' and the parallel resistance $R_{el}$ can be obtained.

$$|S11|' = \frac{|R_{el} - Z_0|}{|R_{el} + Z_0|} \cdot \left|\frac{\cos\left(\operatorname{atan}\left(\frac{Z_0}{R_{el} + Z_0}Q_{el}\left(\frac{\omega_b}{\omega'_0} - \frac{\omega'_0}{\omega_b}\right)\right)\right)}{\cos\left(\operatorname{atan}\left(\frac{Z_0}{R_{el} - Z_0}Q_{el}\left(\frac{\omega_b}{\omega'_0} - \frac{\omega'_0}{\omega_b}\right)\right)\right)}\right| \tag{13}$$

where $\omega'_0$ is the resonant frequency of the radio-frequency transmitting coil having the scanned object.

$$Q_{el} = \frac{R_{ec}R_{es}}{R_{ec} + R_{es}}C_{el}\omega'_0.$$

When the radio-frequency transmitting coil 210 has the scanned object and operates at the resonant frequency, $\omega$ is equal to $\omega'_0$, and equation (13) may be transformed into equation (14).

$$|S11|' = \frac{|R_{el} - Z_0|}{|R_{el} + Z_0|} \tag{14}$$

Since the first input reflection coefficient |S11| can already be acquired by the reflection coefficient determining module 230 (for example, using equation (1)), and the intrinsic impedance $Z_0$ of the radio-frequency transmitting link is a known value, then the resistance value of the radio-frequency transmitting coil 210 may be calculated on the basis of the first input reflection coefficient |S11| when the radio-frequency transmitting coil operates at the resonant frequency $\omega_0$ and the intrinsic impedance $Z_0$ of the radio-frequency transmitting link, for example, by solving equation (12), to obtain the coil resistance $R_{ec}$. Alternatively, equation (11) may be fitted according to the frequency response of the first input reflection coefficient |S11|, to obtain the coil resistance $R_{ec}$.

Moreover, since the second input reflection coefficient |S11|' can also be acquired by the reflection coefficient determining module 230 (for example, using equation (2)), the parallel resistance value may be calculated according to the second input reflection coefficient |S11|' when the radio-frequency transmitting coil operates at the resonant frequency $\omega'_0$ and the intrinsic impedance $Z_0$ of the radio-frequency transmitting link, for example, by solving equation (14), to obtain the total resistance $R_{el}$. Alternatively, equation (13) may be fitted according to the frequency response of the second input reflection coefficient |S11|', to obtain the parallel resistance $R_{el}$.

On the basis of the principles described above, the reflection coefficient determining module 230 can acquire the first input reflection coefficient |S11| of the radio-frequency transmitting coil 210 having no load and the second input reflection coefficient |S11|' when the radio-frequency transmitting coil has the scanned object when the radio-frequency transmitting coil operates at the resonant frequency.

For example, when the radio-frequency transmitting coil operates at the resonant frequency $\omega_0$, a first forward signal and a first reverse signal may be detected by the detecting device 470, and the reflection coefficient determining module 230 acquires first forward power and first reverse power according to the first forward signal and the first reverse signal respectively, and calculates the first input reflection coefficient |S11| using the principle of equation (1).

On the basis of the frequency response of the first input reflection coefficient |S11|, the principle of equation (12) may further be used to acquire the equivalent resistance $R_{ec}$ of the radio-frequency transmitting coil.

When the radio-frequency transmitting coil has the scanned object and exactly operates at the resonant frequency $\omega'_0$, a second forward input signal and a second input reflection signal may be detected by the detecting device 470, and the reflection coefficient determining module 230 acquires second forward power and second reverse power according to the second forward signal and the second reverse signal respectively, and calculates the second input reflection coefficient |S11|' using the principle of equation (2).

On the basis of the frequency response of the second input reflection coefficient |S11|', equations (14) and (15) may further be used to acquire the equivalent total resistance $R_{el}$ of the radio-frequency transmitting coil and the scanned object and the equivalent resistance $R_{es}$ of the scanned object.

Therefore, in another embodiment, the reflection coefficient determining module 230 is configured to acquire frequency responses of first input reflection coefficients and frequency responses of second input reflection coefficients of the radio-frequency transmitting coil 210. The frequency responses of the first input reflection coefficients are input reflection coefficients of the radio-frequency transmitting coil 210 at a plurality of operating frequencies (for example, $\omega_a=\omega_1, \omega_2, \omega_3, \ldots$) respectively, and the frequency responses of the second input reflection coefficients are input reflection coefficients of the radio-frequency transmitting coil 210 having the scanned object at a plurality of operating frequencies ($\omega_b=\omega'_1, \omega'_2, \omega'_3, \ldots$). The resistance value determining module 240 calculate the resistance value $R_{ec}$ of the radio-frequency transmitting coil on the basis of the plurality of first input reflection coefficients and the operating frequencies ($\omega_1, \omega_2, \omega_3, \ldots$)) corresponding thereto (the frequency responses of the first input reflection coefficients), the intrinsic impedance $Z_0$ of the radio-frequency transmitting link, and the resonant frequency $\omega_0$ of the radio-frequency transmitting coil 210, and the resistance value determining module 240 further calculates the parallel resistance value $R_{el}$ of the radio-frequency transmitting coil and the scanned object on the basis of the plurality of second input reflection coefficients and the operating frequencies ($\omega'_1, \omega'_2, \omega'_3, \ldots$) corresponding thereto (the frequency responses of the second input reflection coefficients), the intrinsic impedance $Z_0$ of the radio-frequency transmitting link, and a central frequency $\omega'_0$ of the radio-frequency transmitting coil 210.

For example, the resistance value determining module 240 may acquire the resistance value $R_{ec}$ of the radio-frequency transmitting coil and the aforementioned parallel resistance value $R_{el}$ by solving equations (11) and (13) respectively.

In one embodiment, the detecting device 470 may be controlled during a process of adjusting the radio frequency of the magnetic resonance imaging system to detect the first forward signal, the first reverse signal, the second forward signal, and the second reverse signal. The radio frequency adjustment may itself exist in a working procedure of the magnetic resonance imaging system. Therefore, there is no need to add an additional frequency change procedure to implement the detection of the forward input signal and the input reflection signal.

In addition, when the magnetic resonance imaging system has the scanned object, the second forward signal and the second reverse signal may be detected by the detecting device during a parameter adjustment process before scanning the scanned object or during a pre-scanning process of the scanned object. For example, the detecting device 470 may detect the second forward signal and the second reverse signal during the pre-scanning process of the scanned object. The pre-scan may be performed before any scan sequence is performed. For example, when any scan sequence of a positioning scan or a formal scan is initiated, the pre-scan is performed first, and different operating radio frequencies are tried in the pre-scan stage to find a resonant (central) frequency. After the resonant frequency is determined, imaging scanning can be performed on the basis of the resonant frequency.

In one embodiment, the first input reflection coefficients at different operating frequencies may be pre-stored in the memory 480, and the memory 480 may be accessed by the resistance value determining module 240 to allow acquiring the resistance value $R_{ec}$ of the radio-frequency transmitting coil on the basis of the frequency response of the first input reflection coefficient.

The second input reflection coefficients at different operating frequencies may also be pre-stored in the memory 480, so that the parallel resistance value $R_{el}$ of the radio-frequency transmitting coil and the scanned object can be acquired on the basis of the frequency response of the second input reflection coefficient.

The obtained resistance value $R_{ec}$ and parallel resistance value $R_{el}$ may also be stored in the memory 480 so as to be accessible by the SAR value determining module 250.

Figure 7:
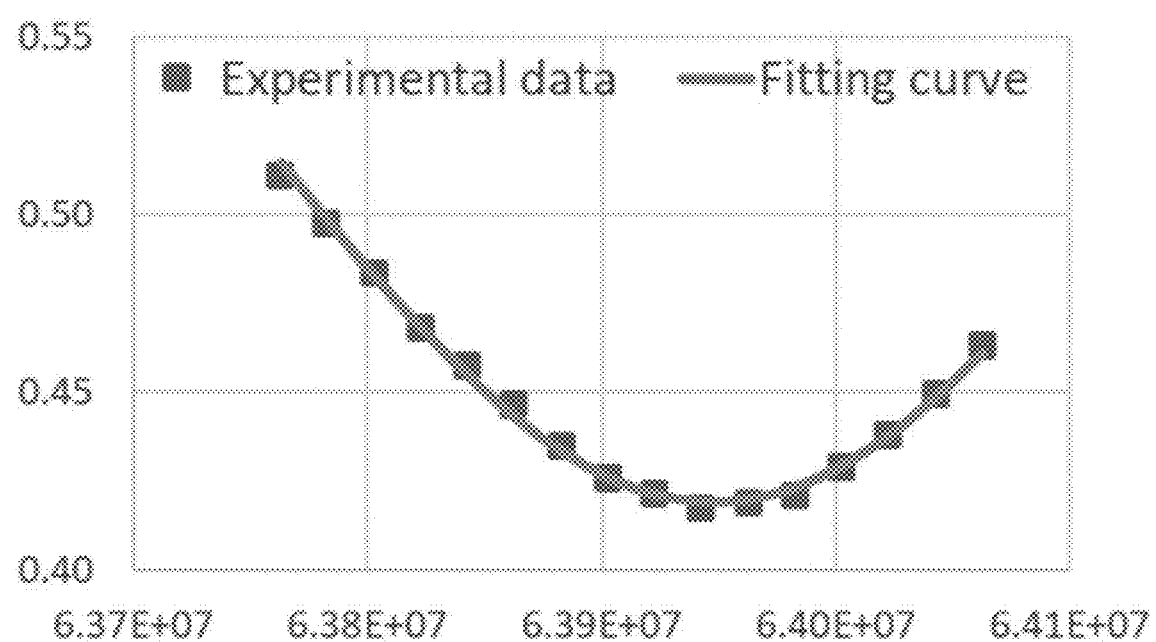
FIG. 7 shows an example diagram of a first frequency response curve of a first input reflection coefficient varying with an operating frequency of a magnetic resonance imaging system according to an embodiment of the present invention.

In one embodiment, the reflection coefficient determining module 230 may also acquire a first frequency response curve of the first input reflection coefficient varying with the operating frequency of the radio-frequency transmitting coil, and may further acquire a second frequency response curve of the second input reflection coefficient varying with the operating frequency of the radio-frequency transmitting coil. FIG. 7 shows an example of the first frequency response curve. In FIG. 7, the horizontal axis represents the operating frequency of the magnetic resonance imaging system, and the vertical axis represents the input reflection coefficient. The first frequency response curve and the second frequency response curve may be obtained by the reflection coefficient determining module 230 by performing a fitting operation on the basis of the acquired plurality of first input reflection coefficients and plurality of second input reflection coefficients, respectively. Moreover, the first frequency response curve and the second frequency response curve may also be pre-stored in the memory 480, so that the resistance value determining module 240 acquires the resistance value of the radio-frequency transmitting coil 210 and the parallel resistance value thereof with the scanned object.

The SAR value of the scanned object may further be determined on the basis of the determined resistance value of the radio-frequency transmitting coil 210 and the aforementioned parallel resistance value, which will be further described in detail below in conjunction with FIG. 6.

According to FIG. 6, it can be learned that the total resistance $R_{el}$, the coil resistance $R_{ec}$, and the scanned object resistance $R_{es}$ satisfy the following relationship (15).

$$\frac{1}{R_{el}} = \frac{1}{R_{ec}} + \frac{1}{R_{es}} \tag{15}$$

Since the parallel resistance value $R_{el}$ and the resistance value $R_{ec}$ of the radio-frequency transmitting coil can be acquired according to the embodiments described above, the resistance value $R_{es}$ of the scanned object can further be acquired according to equation 15.

When there is the scanned object, total power currently actually transmitted to the radio-frequency transmitting coil (incident radio-frequency power) $P_{in}$ is currently detected second forward power $P'_f$ minus second reverse power $P'_r$, i.e., $$P'_{in} = P'_f - P'_r \tag{16}$$

where $P'_f = \frac{V_f'^2}{Z_0}, P'_r = \frac{V_r'^2}{Z_0}$.

Part of the actual transmitted total power $P'_{in}$ is absorbed by the radio-frequency transmitting coil 210, and the other part is absorbed by the scanned object, and the proportion $\eta$ of the power absorbed by the scanned object in the total power $P'_{in}$ may be obtained by the following equation (17) or a variant equation thereof.

$$\eta = \frac{1}{k+1} \tag{17}$$

where $k = \dfrac{R_{es}}{R_{ec}}$.

Since the SAR value of the scanned object is heat absorbed by the unit weight of the scanned object per unit time, assuming that the weight of the scanned object is M, then the SAR value of the scanned object is average power for that weight. The average power may be represented by the following equation (18):

$$\overline{P'_{in}} = \dfrac{\int_0^{T_{scan}} P'_{in} dt}{T_{scan}} \tag{18}$$

The current SAR value of the scanned object may further be calculated using the following equation (19) or a variant equation thereof.

$$SAR = \dfrac{\eta \overline{P'_{in}}}{M} = \dfrac{\overline{P'_{in}}}{M(k+1)} \tag{19}$$

Combining equations (18) and (19), the following equation (20) can be obtained.

$$SAR = \dfrac{\int_0^{T_{scan}} P'_{in} dt}{T_{scan} M(k+1)} \tag{20}$$

Therefore, the SAR value determining module 250 is further configured to receive a second forward signal and a second reverse signal that are currently detected, and calculate, on the basis of the second forward signal and the second reverse signal that are currently detected, total radio-frequency power absorbed by the radio-frequency transmitting coil and the scanned object, and calculate the SAR value of the scanned object on the basis of the total radio-frequency power, the weight of the scanned object, and the ratio between the resistance value of the scanned object to the resistance value of the radio-frequency transmitting coil. For example, the incident radio-frequency power P'$_{in}$ may be calculated on the basis of equation (16), and the SAR value may further be calculated on the basis of equations (19) and (20) or variant equations thereof.

A magnetic resonance imaging system in another embodiment of the present invention may include: a radio-frequency transmitting coil, configured to receive radio-frequency power from a radio-frequency transmitting link and transmit radio-frequency power required for imaging to a scanned object; a resistance value determining module, configured to acquire resistance values of the radio-frequency transmitting coil and the scanned object; and a SAR value determining module, configured to determine total radio-frequency power absorbed by the radio-frequency transmitting coil and the scanned object when the radio-frequency power is transmitted to the radio-frequency transmitting coil, and calculate the SAR value of the scanned object on the basis of the ratio of the resistance values of the radio-frequency transmitting coil and the scanned object and the total radio-frequency power.

This embodiment is similar to the magnetic resonance imaging system of any of the above embodiments. One difference may be that the resistance value of the radio-frequency transmitting coil and the resistance value of the scanned object may be acquired using other methods (for example, direct measurement or other more accurate evaluation methods) instead of on the basis of reflection coefficients. Alternatively, the aforementioned resistance values are pre-stored in a memory (for example, a memory 480), and the resistance value determining module can access the memory to retrieve the resistance values for the SAR value determining module to calculate the SAR value. The pre-stored resistance values may be acquired using the method according to any of the embodiments described in the present invention.

Figure 8:
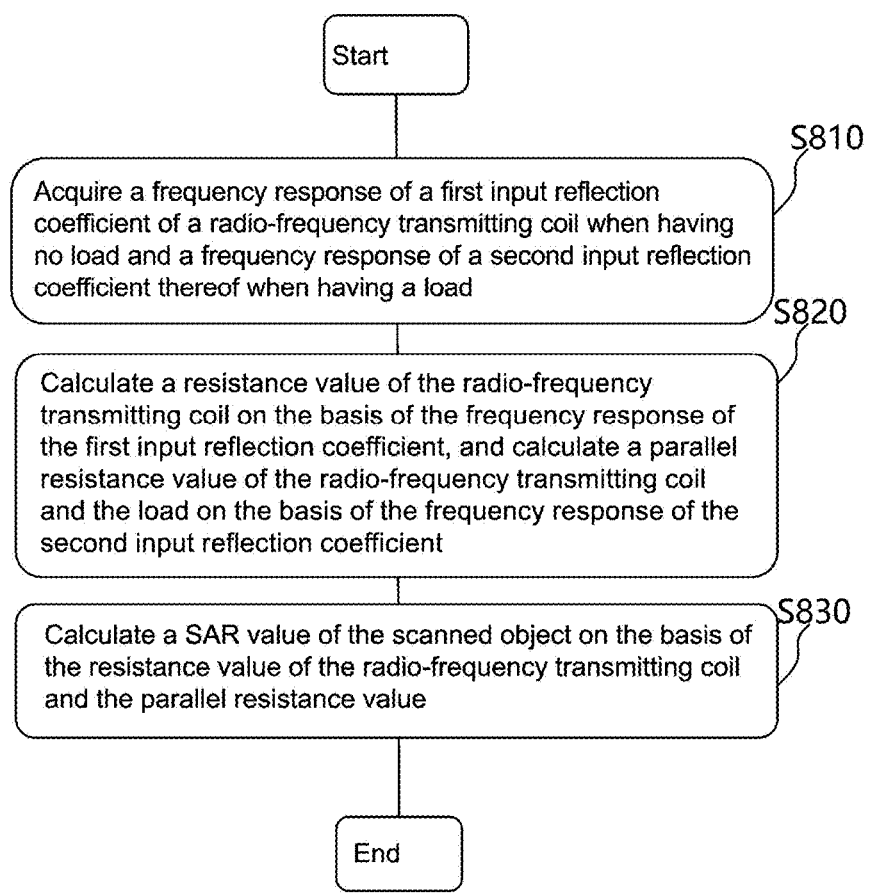
FIG. 8 shows a flowchart of a method for determining a SAR value of a magnetic resonance imaging system according to some embodiments of the present invention.

FIG. 8 shows a flowchart 800 of a method for determining a SAR value of a magnetic resonance imaging system according to an embodiment of the present invention. The magnetic resonance imaging system may be the system described in any of the above embodiments. As shown in FIG. 8, in step S810, a frequency response of a first input reflection coefficient |S111| of a radio-frequency transmitting coil when having no load and a frequency response of a second input reflection coefficient |S111'| thereof when having a scanned object are acquired. In step S820, a resistance value $R_{ec}$ of the radio-frequency transmitting coil is calculated on the basis of the frequency response of the first input reflection coefficient |S111|, and a parallel resistance value $R_{el}$ of the radio-frequency transmitting coil and the scanned object is calculated on the basis of the frequency response of the second input reflection coefficient |S111'|. In step S830, a SAR value of the scanned object is calculated on the basis of the resistance value $R_{ec}$ of the radio-frequency transmitting coil and the parallel resistance value $R_{el}$.

Optionally, the method may further include the following steps: controlling a signal receiving and detecting device to detect a first forward signal and a first reverse signal when the radio-frequency transmitting coil has no load, and detects a second forward signal and a second reverse signal when the radio-frequency transmitting coil has the scanned object, where the signal receiving and detecting device may include the aforementioned directional coupler and the corresponding power meter or other power/voltage/current measuring devices connected to the coupler.

Specifically, the first forward signal, the first reverse signal, the second forward signal, and the second reverse signal may be detected during a process of adjusting an operating frequency of the radio-frequency transmitting coil. For example, the aforementioned forward signals and reverse signals may be detected and fed back by the detecting device during the process of adjusting the operating frequency of the radio-frequency transmitting coil.

For example, the first forward signal and the first reverse signal may be detected during system calibration performed on the magnetic resonance imaging system.

For another example, the second forward signal and the second reverse signal may be detected during a pre-scanning process of the scanned object.

In step S810, the detected first forward signal and first reverse signal may be received, and the frequency response of the first input reflection coefficient |S111| is calculated on the basis of a frequency response of the first forward signal and a frequency response of the first reverse signal; the detected second forward signal and second reverse signal may also be received, and the frequency response of the second input reflection coefficient |S111'| is calculated on the basis of a frequency response of the second forward signal and a frequency response of the second reverse signal.

In one embodiment, the frequency response of the first input reflection coefficient and the frequency response of the second input reflection coefficient are input reflection coefficients when the radio-frequency transmitting coil is operating at a resonant frequency. For example, when the radio-frequency transmitting coil is operating at the resonant frequency, the forward signal and the reverse signal are detected, and the first input reflection coefficient and the second input reflection coefficient are calculated on the basis of the detected signals. In this case, in step S820, the resistance value of the radio-frequency transmitting coil may be calculated on the basis of the frequency response of the first input reflection coefficient at the resonant frequency and an intrinsic impedance of the radio-frequency transmitting link. Specifically, the resistance value of the radio-frequency transmitting coil is calculated on the basis of the first reflection coefficient, the intrinsic impedance of the radio-frequency transmitting link, and equation (12) or a variant equation thereof.

In step S820, the parallel resistance value may be calculated on the basis of the frequency response of the second input reflection coefficient at the resonant frequency and the resonant frequency and the intrinsic impedance of the radio-frequency transmitting link. Specifically, the parallel resistance value is calculated on the basis of the second reflection coefficient, the intrinsic impedance of the radio-frequency transmitting link, and equation (14).

In another embodiment, the frequency response of the first input reflection coefficient and the frequency response of the second input reflection coefficient respectively include a plurality of first input reflection coefficients and a plurality of second input reflection coefficients at a plurality of operating frequencies of the radio-frequency transmitting coil. In this case, in step S820, the resistance value of the radio-frequency transmitting coil may be calculated on the basis of the plurality of first input reflection coefficients and the operating frequencies corresponding thereto, the intrinsic impedance of the radio-frequency transmitting link, and the operating frequency of the radio-frequency transmitting coil. For example the resistance of the radio-frequency transmitting coil is calculated on the basis of equation (11). Correspondingly, in step S820, the parallel resistance value of the radio-frequency transmitting coil and the scanned object may be calculated on the basis of the plurality of second input reflection coefficients and the operating frequencies corresponding thereto, the intrinsic impedance of the radio-frequency transmitting link, and a central frequency of the radio-frequency transmitting coil. For example, the parallel resistance value is calculated on the basis of equation (13).

Further, in step S810, a first frequency response curve of the first input reflection coefficient varying with the operating frequency of the radio-frequency transmitting coil may be acquired, and a second frequency response curve of the second input reflection coefficient varying with the operating frequency of the radio-frequency transmitting coil may be acquired. In this case, in step S820, a plurality of first input reflection coefficient values on the first frequency response curve may be extracted, and a plurality of second input reflection coefficient values on the second frequency response curve may be extracted.

In step S830, the following steps may be included:

In a first step: a second forward signal and a second reverse signal that are currently detected are received, and current incident radio-frequency power is calculated on the basis of the currently detected second forward signal and second reverse signal, which is regarded as total radio-frequency power currently absorbed by the transmitting coil and the scanned object. For example, the current total radio-frequency power may be calculated on the basis of equation (16).

In a second step: the SAR value of the scanned object is calculated on the basis of the total radio-frequency power, the weight of the scanned object, and the ratio of the resistance value of the scanned object to the resistance value of the radio-frequency transmitting coil. For example, the SAR value may be calculated on the basis of equation (20) or a variant equation thereof. Specifically, the second step may include:

calculating the proportion of radio-frequency power absorbed by the scanned object in the total radio-frequency power on the basis of the ratio of the resistance value of the scanned object to the resistance value of the radio-frequency transmitting coil (where the resistance value of the scanned object is calculated on the basis of the parallel resistance value and the resistance value of the radio-frequency transmitting coil), and calculating the SAR value of the scanned object on the basis of the total radio-frequency power, the weight of the scanned object, and the proportion.

The aforementioned reflection coefficient determining module 240, resistance value determining module 240, and SAR value determining module 250 may separately or collectively include a memory 480 and a processor.

Therefore, the present invention may further provide a magnetic resonance imaging system according to another embodiment, which includes a radio-frequency transmitting coil and a processor. The radio-frequency transmitting coil is configured to acquire radio-frequency power through a radio-frequency transmitting link and transmit radio-frequency power required for imaging to a scanned object. The processor is configured to perform the method for determining a SAR value of a magnetic resonance imaging system according to any of the above embodiments. For example, the processor is configured to perform the following operations: acquiring a frequency response of a first input reflection coefficient of the radio-frequency transmitting coil when having no load; acquiring a frequency response of a second input reflection coefficient of the radio-frequency transmitting coil when having the scanned object; calculating a resistance value of the radio-frequency transmitting coil on the basis of the first input reflection coefficient, and calculating a parallel resistance value of the radio-frequency transmitting coil and the scanned object on the basis of the second input reflection coefficient; and calculating a SAR value of the scanned object on the basis of the resistance value of the radio-frequency transmitting coil and the parallel resistance value.

In an embodiment, the aforementioned reflection coefficient determining module 230, resistance value determining module 240, and SAR value determining module 250 may separately or collectively include a storage medium on which a predetermined data processing program to be executed by a computer processor is recorded. For example, the storage medium may store a program for implementing the method for determining a SAR value according to the embodiments of the present invention. The storage medium may include, for example, a ROM, a floppy disk, a hard disk, an optical disk, a magneto-optical disk, a CD-ROM, or a non-volatile memory card.

Therefore, an embodiment of the present invention may further provide a computer-readable storage medium, which includes a stored computer program, where any of the above embodiments of the methods for determining a SAR value of a magnetic resonance imaging system is performed when the computer program is executed.

The embodiments of the present invention determine a coil resistance value of a radio-frequency transmitting coil and a parallel resistance value of the coil and a scanned object respectively on the basis of frequency responses of input reflection coefficients of the radio-frequency transmitting coil when the coil has no load and has the scanned object, to determine a SAR value of the scanned object on the basis of the resistance value and the parallel resistance value, so that a more accurate SAR value can be obtained without adding an additional pick-up coil, and design costs brought in order to reduce interference between the pick-up coil and the radio-frequency transmitting coil are avoided. Comparing the SAR value obtained by using the embodiments of the present invention at different operating frequencies with a SAR value obtained by using a pick-up coil at corresponding operating frequencies, it is found that a maximum error therebetween is only 3.6%. It can be seen that the SAR value obtained by using the embodiments of the present invention is more accurate.

By acquiring the more accurate SAR value, scan parameters set on the basis of the SAR value are more proper, and better image quality or clinical experience can be obtained under the premise of safe scanning. For example, if the obtained accurate SAR value is less than a conservatively estimated SAR value, scan time can be appropriately reduced (for example, setting shorter repetition time TR) to meet higher imaging requirements. Certainly, the setting of the scan time is only an example of one of parameters that can be adjusted or set, and other scan parameters may also be adjusted on the basis of the accurately calculated SAR value.

In addition, by considering the radio-frequency transmitting coil as a whole, input reflection coefficients thereof can be quickly acquired. This is simpler to implement. For a transmitting coil with a plurality of transmitting channels, there is no need to detect scattering parameters between ports to obtain complete electrical parameters of a circuit, but it is only needed for a radio-frequency transmission link of each channel to transmit radio-frequency power to a port of the radio-frequency transmission coil to independently measure a frequency response of a forward signal and a frequency response of a reverse signal of each channel, thus reducing the complexity of calculation and avoiding delay issues caused by excessive signal detection.

The purpose of providing the above specific embodiments is to facilitate understanding of the content disclosed in the present invention more thoroughly and comprehensively, but the present invention is not limited to these specific embodiments. Those skilled in the art should understand that various modifications, equivalent replacements, and changes can also be made to the present invention and should be included in the scope of protection of the present invention as long as these changes do not depart from the spirit of the present invention.

The invention claimed is:

1. A magnetic resonance imaging system, comprising:
a radio-frequency transmitting coil, configured to receive radio-frequency power from a radio-frequency transmitting link and transmit radio-frequency power required for imaging to a scanned object;
a reflection coefficient determining module, configured to acquire a frequency response of a first input reflection coefficient of the radio-frequency transmitting coil when having no load and a frequency response of a second input reflection coefficient thereof when having the scanned object;
a resistance value determining module, configured to determine a resistance value of the radio-frequency transmitting coil on the basis of the frequency response of the first input reflection coefficient, and determine a parallel resistance value of the radio-frequency transmitting coil and the scanned object on the basis of the frequency response of the second input reflection coefficient; and
a SAR value determining module, configured to calculate a SAR value of the scanned object on the basis of the resistance value of the radio-frequency transmitting coil and the parallel resistance value.

2. The system according to claim 1, wherein the reflection coefficient determining module is configured to:
receive a first forward signal and a first reverse signal that are detected when the radio-frequency transmitting coil has no load;
receive a second forward signal and a second reverse signal that are detected when the radio-frequency transmitting coil has the scanned object;
calculate the frequency response of the first input reflection coefficient on the basis of a frequency response of the first forward signal and a frequency response of the first reverse signal; and
calculate the frequency response of the second input reflection coefficient on the basis of a frequency response of the second forward signal and a frequency response of the second reverse signal.

3. The system according to claim 2, further comprising a signal receiving and detecting device disposed at a transmission line port of the radio-frequency transmitting link, the signal receiving and detecting device being configured to detect the first forward signal, the first reverse signal, the second forward signal, and the second reverse signal.

4. The system according to claim 2, wherein the SAR value determining module is further configured to:
receive the second forward signal and the second reverse signal that are currently detected, and calculate, on the basis of the second forward signal and the second reverse signal that are currently detected, total radio-frequency power currently absorbed by the radio-frequency transmitting coil and the scanned object;
calculate the proportion of radio-frequency power absorbed by the scanned object in the total radio-frequency power on the basis of a ratio of a resistance value of the scanned object to the resistance value of the radio-frequency transmitting coil, wherein the resistance value of the scanned object is calculated on the basis of the parallel resistance value and the resistance value of the radio-frequency transmitting coil; and
calculate the SAR value of the scanned object on the basis of the total radio-frequency power, a weight of the scanned object, and the proportion.

5. The system according to claim 1, wherein the resistance value determining module is configured to calculate the resistance value of the radio-frequency transmitting coil on the basis of the frequency response of the first input reflection coefficient and an intrinsic impedance of the radio-frequency transmitting link, and the resistance value determining module is further configured to calculate the parallel resistance value of the radio-frequency transmitting coil and the scanned object on the basis of the frequency response of the second input reflection coefficient and the intrinsic impedance of the radio-frequency transmitting link.

6. The system according to claim 5, further comprising a memory for storing at least one of the frequency response of the first input reflection coefficient, the frequency response of the second input reflection coefficient, the resistance value of the radio-frequency transmitting coil, and the parallel resistance value.

7. The system according to claim 5, wherein the resistance value determining module calculates the resistance value of the radio-frequency transmitting coil on the basis of the following equation:

$$|S11| = \frac{|R_{ec} - Z_0|}{|R_{ec} + Z_0|} \cdot \frac{\left|\cos\left(\mathrm{atan}\left(\frac{Z_0}{R_{ec} + Z_0} Q_{ec}\left(\frac{\omega_a}{\omega_0} - \frac{\omega_0}{\omega_a}\right)\right)\right)\right|}{\left|\cos\left(\mathrm{atan}\left(\frac{Z_0}{R_{ec} - Z_0} Q_{ec}\left(\frac{\omega_a}{\omega_0} - \frac{\omega_0}{\omega_a}\right)\right)\right)\right|}$$

the resistance value determining module calculates the parallel resistance value of the radio-frequency transmitting coil and the scanned object on the basis of the following equation:

$$|S11|' = \frac{|R_{el} - Z_0|}{|R_{el} + Z_0|} \cdot \frac{\left|\cos\left(\mathrm{atan}\left(\frac{Z_0}{R_{el} + Z_0} Q_{el}\left(\frac{\omega_b}{\omega'_0} - \frac{\omega'_0}{\omega_b}\right)\right)\right)\right|}{\left|\cos\left(\mathrm{atan}\left(\frac{Z_0}{R_{el} - Z_0} Q_{el}\left(\frac{\omega_b}{\omega'_0} - \frac{\omega'_0}{\omega_b}\right)\right)\right)\right|}$$

wherein $R_{ec}$ is the resistance value of the radio-frequency transmitting coil, $R_{el}$ is the parallel resistance value of the radio-frequency transmitting coil and the scanned object, $|S11|$ is the first input reflection coefficient when an operating frequency of the radio-frequency transmitting coil is $\omega_a$, $|S11'|$ is the second input reflection coefficient when the operating frequency of the radio-frequency transmitting coil is $\omega_b$, $Z_0$ is the intrinsic impedance of the radio-frequency transmitting link, which is a known value, $\omega_0$, is a resonant frequency of the radio-frequency transmitting coil when having no load, $\omega'_0$ is a resonant frequency of the radio-frequency transmitting coil when having the scanned object, $Q_{sc}=R_{ec}C_{ec}\omega_0$, and $Q_{el}=R_{el}C_{el}\omega_0$, wherein $C_{ec}$ is an equivalent capacitance of the radio-frequency transmitting coil when having no load, and $C_{ei}$ is an equivalent parallel capacitance of the radio-frequency transmitting coil and the scanned object when the radio-frequency transmitting coil has the scanned object.

8. The system according to claim 1, wherein
the frequency response of the first input reflection coefficient comprises: a frequency response of the first input reflection coefficient at a resonant frequency of the radio-frequency transmitting coil when the radio-frequency transmitting coil has no load;
the frequency response of the second input reflection coefficient comprises: a frequency response of the second input reflection coefficient at a resonant frequency of the radio-frequency transmitting coil when the radio-frequency transmitting coil has the scanned object;
the resistance value determining module is further configured to:
calculate the resistance value of the radio-frequency transmitting coil on the basis of the frequency response of the first input reflection coefficient at the resonant frequency and an intrinsic impedance of the radio-frequency transmitting link; and
calculate the parallel resistance value on the basis of the frequency response of the second input reflection coefficient at the resonant frequency and the intrinsic impedance of the radio-frequency transmitting link.

9. A method for determining a SAR value of a magnetic resonance imaging system, the magnetic resonance imaging system comprising a radio-frequency transmitting coil configured to receive radio-frequency power from a radio-frequency transmitting link and transmit radio-frequency power required for imaging to a scanned object, the method comprising:
acquiring a frequency response of a first input reflection coefficient of the radio-frequency transmitting coil when having no load and a frequency response of a second input reflection coefficient thereof when having the scanned object;
determining a resistance value of the radio-frequency transmitting coil on the basis of the frequency response of the first input reflection coefficient, and determining a parallel resistance value of the radio-frequency transmitting coil and the scanned object on the basis of the frequency response of the second input reflection coefficient; and
calculating a SAR value of the scanned object on the basis of the resistance value of the radio-frequency transmitting coil and the parallel resistance value.

10. The method according to claim 9, wherein the step of acquiring the first input reflection coefficient and the second input reflection coefficient comprises:
receiving a first forward signal and a first reverse signal that are detected when the radio-frequency transmitting coil has no load;
receiving a second forward signal and a second reverse signal that are detected when the radio-frequency transmitting coil has the scanned object;
calculating the frequency response of the first input reflection coefficient on the basis of a frequency response of the first forward signal and a frequency response of the first reverse signal; and
calculating the frequency response of the second input reflection coefficient on the basis of a frequency response of the second forward signal and a frequency response of the second reverse signal.

11. The method according to claim 10, wherein a signal receiving and detecting device is controlled to detect the first forward signal, the first reverse signal, the second forward signal, and the second reverse signal, wherein the signal receiving and detecting device is disposed at a transmission line port of the radio-frequency transmitting link.

12. The method according to claim 11, wherein the first forward signal, the first reverse signal, the second forward signal, and the second reverse signal are detected during a process of adjusting an operating frequency of the radio-frequency transmitting coil.

13. The method according to claim 12, wherein the first forward signal and the first reverse signal are detected during system calibration performed on the magnetic resonance imaging system.

14. The method according to claim 12, wherein the second forward signal and the second reverse signal are detected during a process of pre-scanning of the scanned object.

15. The system according to claim 10, wherein the step of calculating the SAR value comprises:
receiving the second forward signal and the second reverse signal that are currently detected, and calculating, on the basis of the current second forward signal and second reverse signal, total radio-frequency power currently absorbed by the radio-frequency transmitting coil and the scanned object;

calculating the proportion of radio-frequency power absorbed by the scanned object in the total radio-frequency power on the basis of a ratio of a resistance value of the scanned object to the resistance value of the radio-frequency transmitting coil, wherein the resistance value of the scanned object is calculated on the basis of the parallel resistance value and the resistance value of the radio-frequency transmitting coil; and calculating the SAR value of the scanned object on the basis of the total radio-frequency power, a weight of the scanned object, and the proportion.

16. The method according to claim 9, wherein the resistance value of the radio-frequency transmitting coil is calculated on the basis of the frequency response of the first input reflection coefficient and an intrinsic impedance of the radio-frequency transmitting link; and the parallel resistance value is calculated on the basis of the frequency response of the second input reflection coefficient and the intrinsic impedance of the radio-frequency transmitting link.

17. The method according to claim 16, wherein the frequency response of the first input reflection coefficient comprises: a frequency response of the first input reflection coefficient at a resonant frequency of the radio-frequency transmitting coil when the radio-frequency transmitting coil has no load;

the frequency response of the second input reflection coefficient comprises: a frequency response of the second input reflection coefficient at a resonant frequency of the radio-frequency transmitting coil when the radio-frequency transmitting coil has the scanned object;

the method further comprises:

calculating the resistance value of the radio-frequency transmitting coil on the basis of the frequency response of the first input reflection coefficient at the resonant frequency and the intrinsic impedance of the radio-frequency transmitting link; and calculating the parallel resistance value on the basis of the frequency response of the second input reflection coefficient at the resonant frequency and the intrinsic impedance of the radio-frequency transmitting link.

18. The method according to claim 16, wherein the resistance value of the radio-frequency transmitting coil is calculated on the basis of the following equation:

$$|S11| = \frac{|R_{ec} - Z_0|}{|R_{ec} + Z_0|} \cdot \left|\frac{\cos\left(\mathrm{atan}\left(\frac{Z_0}{R_{ec} + Z_0}Q_{ec}\left(\frac{\omega_a}{\omega_0} - \frac{\omega_0}{\omega_a}\right)\right)\right)}{\cos\left(\mathrm{atan}\left(\frac{Z_0}{R_{ec} - Z_0}Q_{ec}\left(\frac{\omega_a}{\omega_0} - \frac{\omega_0}{\omega_a}\right)\right)\right)}\right|;$$

the parallel resistance value of the radio-frequency transmitting coil and the scanned object is calculated on the basis of the following equation:

$$|S11|' = \frac{|R_{el} - Z_0|}{|R_{el} + Z_0|} \cdot \left|\frac{\cos\left(\mathrm{atan}\left(\frac{Z_0}{R_{el} + Z_0}Q_{el}\left(\frac{\omega_b}{\omega'_0} - \frac{\omega'_0}{\omega_b}\right)\right)\right)}{\cos\left(\mathrm{atan}\left(\frac{Z_0}{R_{el} - Z_0}Q_{el}\left(\frac{\omega_b}{\omega'_0} - \frac{\omega'_0}{\omega_b}\right)\right)\right)}\right|;$$

wherein $R_{ec}$ is the resistance value of the radio-frequency transmitting coil, $R_{el}$ is the parallel resistance value of the radio-frequency transmitting coil and the scanned object, $|S11|$ is the first input reflection coefficient when an operating frequency of the radio-frequency transmitting coil is $\omega_a$, $|S11|'$ is the second input reflection coefficient when the operating frequency of the radio-frequency transmitting coil is $\omega_b$, $Z_0$ is the intrinsic impedance of the radio-frequency transmitting link, which is a known value, $\omega_0$ is a resonant frequency of the radio-frequency transmitting coil when having no load, $\omega'_0$ is a resonant frequency of the radio-frequency transmitting coil when having the scanned object, $Q_{ec}=R_{ec}C_{ec}\omega_0$, and $Q_{el}=R_{el}C_{el}\omega_0$, wherein $C_{ec}$ is an equivalent capacitance of the radio-frequency transmitting coil when having no load, and $C_{el}$ is an equivalent parallel capacitance of the radio-frequency transmitting coil and the scanned object when the radio-frequency transmitting coil has the scanned object.

19. A magnetic resonance imaging system, comprising:

the radio-frequency transmitting coil, configured to acquire the radio-frequency power through the radio-frequency transmitting link and transmit the radio-frequency power required for imaging to the scanned object; and a processor, configured to perform the method according to claim 9.

20. A magnetic resonance imaging system, comprising:

a radio-frequency transmitting coil, configured to receive radio-frequency power from a radio-frequency transmitting link and transmit radio-frequency power required for imaging to a scanned object;

a resistance value determining module, configured to determine a ratio of resistance values of the radio-frequency transmitting coil and the scanned object; and a SAR value determining module, configured to determine total radio-frequency power absorbed by the radio-frequency transmitting coil and the scanned object when the radio-frequency power is transmitted to the radio-frequency transmitting coil, and calculate a SAR value of the scanned object on the basis of the ratio and the total radio-frequency power.

\* \* \* \* \*